(12) United States Patent
Yoshida (10) Patent No.: US 10,862,437 B2
(45) Date of Patent: Dec. 8, 2020

(54) AMPLIFICATION DEVICE

(71) Applicant: Onkyo Corporation, Osaka (JP)

(72) Inventor: Makoto Yoshida, Osaka (JP)

(*) Notice: Subject to any disclaimer, the term of this patent is extended or adjusted under 35 U.S.C. 154(b) by 39 days.

(21) Appl. No.: 16/388,529

(22) Filed: Apr. 18, 2019

(65) Prior Publication Data

US 2019/0341890 A1   Nov. 7, 2019

(30) Foreign Application Priority Data

May 7, 2018   (JP) ................... 2018-089266

(51) Int. Cl.
*H03F 3/217*   (2006.01)
*H03F 1/32*   (2006.01)
*H03F 3/30*   (2006.01)

(52) U.S. Cl.
CPC .......... *H03F 1/3217* (2013.01); *H03F 3/3066* (2013.01); *H03F 2200/129* (2013.01)

(58) Field of Classification Search
CPC .................. H03F 3/217; H03F 3/04
USPC ....................... 330/251, 207 A, 288
See application file for complete search history.

(56) References Cited

U.S. PATENT DOCUMENTS

| 4,433,303 A * | 2/1984 | Sasaki | H03F 3/3044 330/264 |
| 4,433,305 A * | 2/1984 | Ozawa | H03F 1/32 330/288 |
| 4,540,951 A * | 9/1985 | Ozawa | H03F 1/32 330/267 |
| 8,907,728 B2 * | 12/2014 | Watkins | H03F 1/48 330/295 |

FOREIGN PATENT DOCUMENTS

JP   2011-182173 A   9/2011

* cited by examiner

*Primary Examiner* — Henry Choe (57) ABSTRACT

An amplification device comprising: a push pull circuit which amplifies an input signal; a diamond buffer circuit to which the signal which is amplified by the push pull circuit is input; and a current mirror circuit which is connected to a power supply and the diamond buffer circuit and is connected to a retraction current terminal of the push pull circuit.

4 Claims, 14 Drawing Sheets

Fig. 14

AMPLIFICATION DEVICE

CROSS-REFERENCE TO RELATED APPLICATIONS

This application claims priority to Japanese Application No. 2018-089266, filed May 7, 2018, the entire contents of which are incorporated herein by reference.

FIELD

The present invention relates to an amplification device which amplifies a signal.

BACKGROUND

Figure 9:
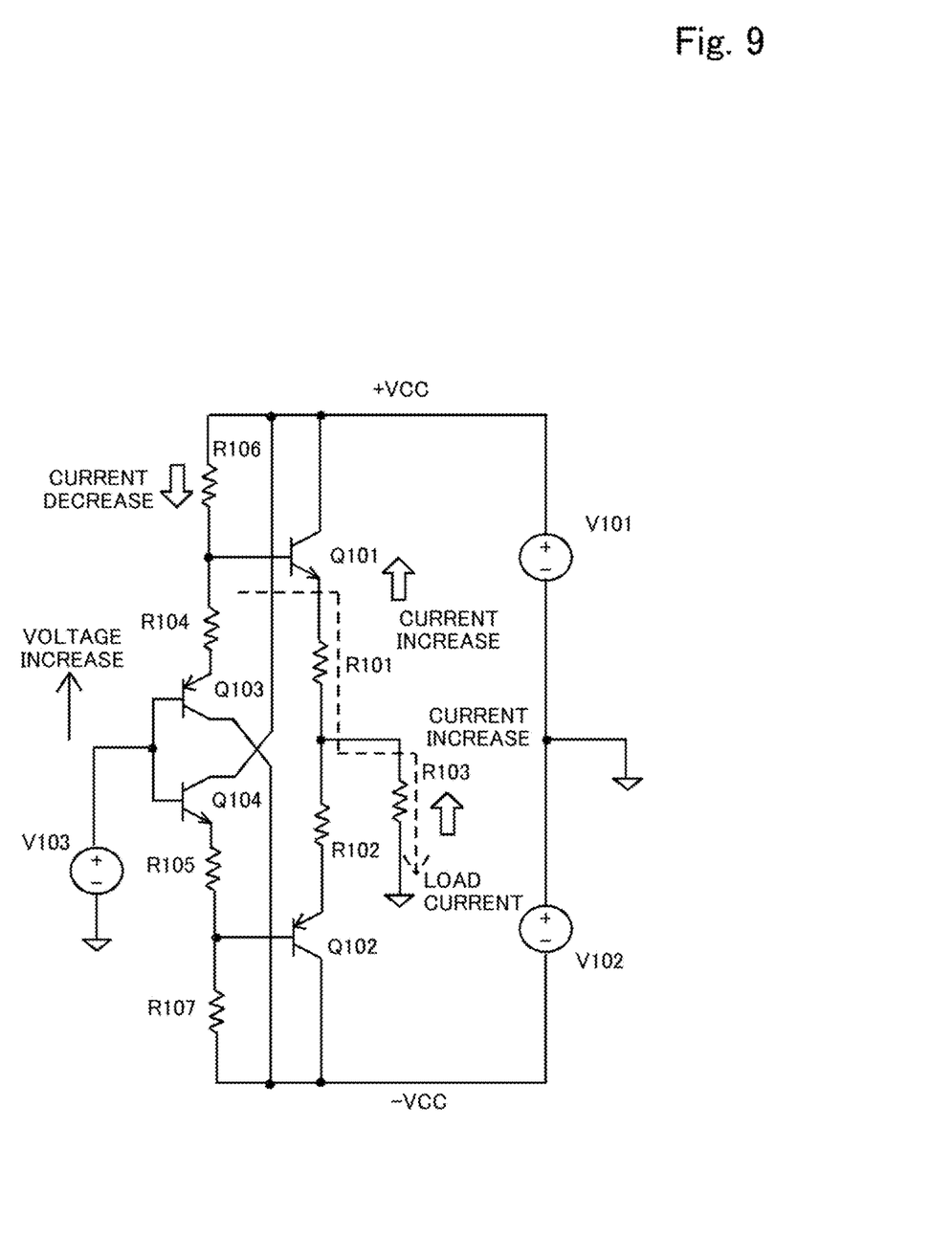
FIG. 9 is a diagram illustrating a configuration of a diamond buffer circuit.
Figure 10:
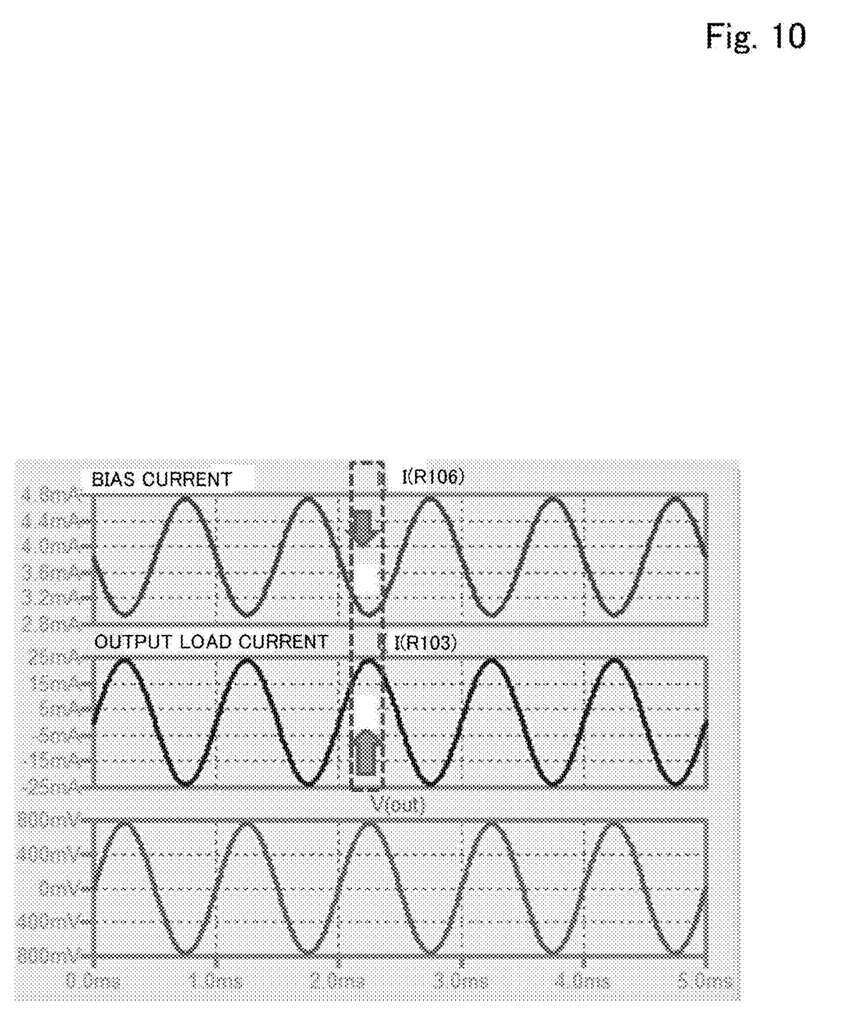

FIG. 9 is a diagram illustrating a configuration of a circuit which is called a diamond buffer (for example, see FIG. 5 of JP 2011-182173 A). As illustrated in FIG. 9, the diamond buffer circuit has bipolar transistors Q101 to Q104, and resistors R101, R102, and R104 to R107. R103 is a load. In the diamond buffer circuit, bias current of output stage base side flows to the resistors R106 and R104. When output voltage increases and current which flows to the load R103 increases, output current of the bipolar transistor Q101 increases and base current also increases. For this reason, in the bias current, sufficient current is expected for supply. However, the bias current of the base side decreases in contrast (see FIG. 10). This is because when input voltage increases, base voltage of the bipolar transistor Q103 increases. Along with this, potential of an emitter increases and potential difference of potential of the emitter and +VCC becomes small. The bias current is decided by potential difference of the emitter potential of the bipolar transistor Q103 and +VCC and value of the resistor R104. For this reason, when amplitude of output is large, decrease becomes remarkable. In FIG. 10, an upper graph illustrates the bias current, a middle graph illustrates load current, and a lower graph illustrates output voltage.

Figure 11:
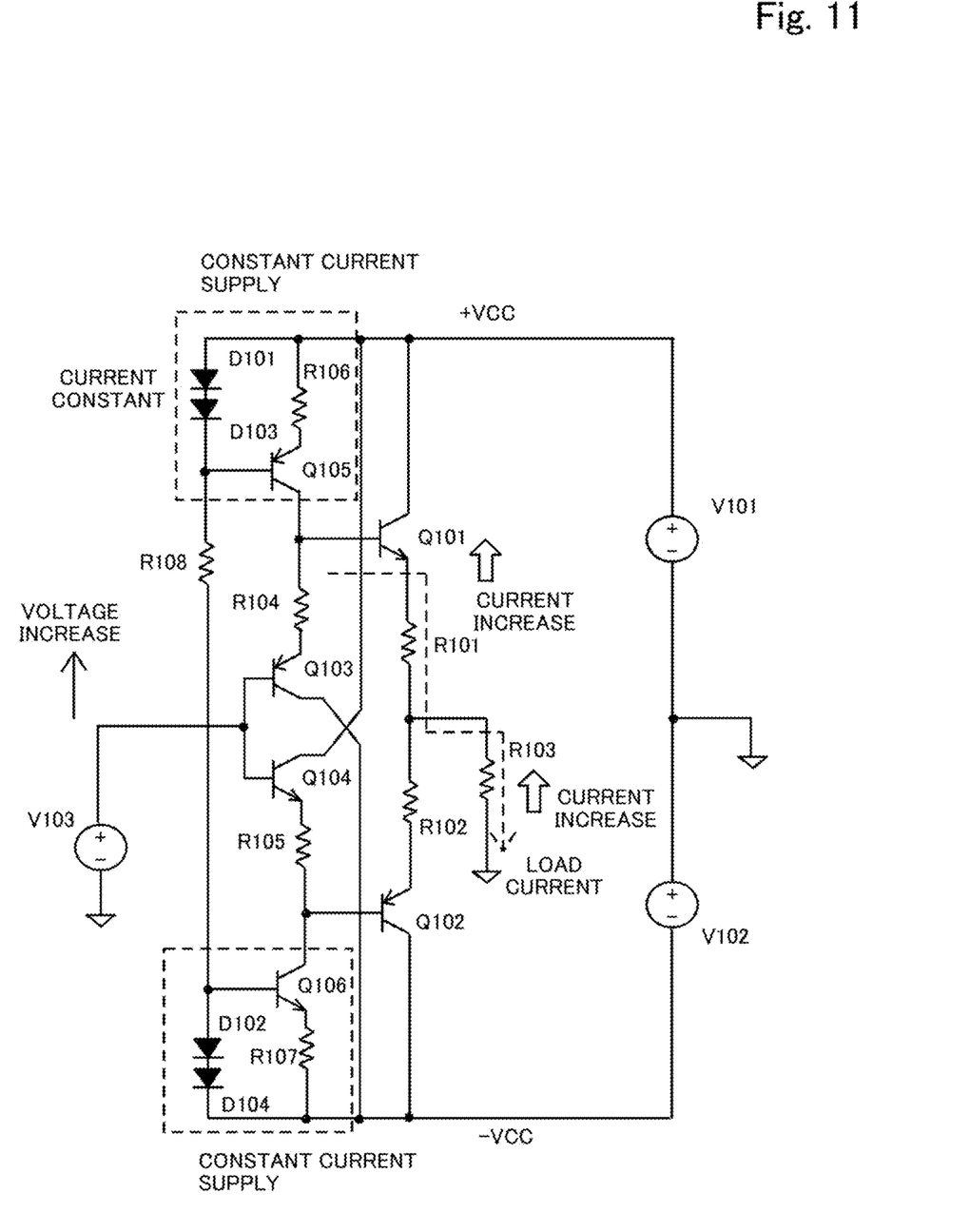
FIG. 11 is a diagram illustrating a configuration of a circuit that the diamond buffer circuit is improved.
Figure 12:
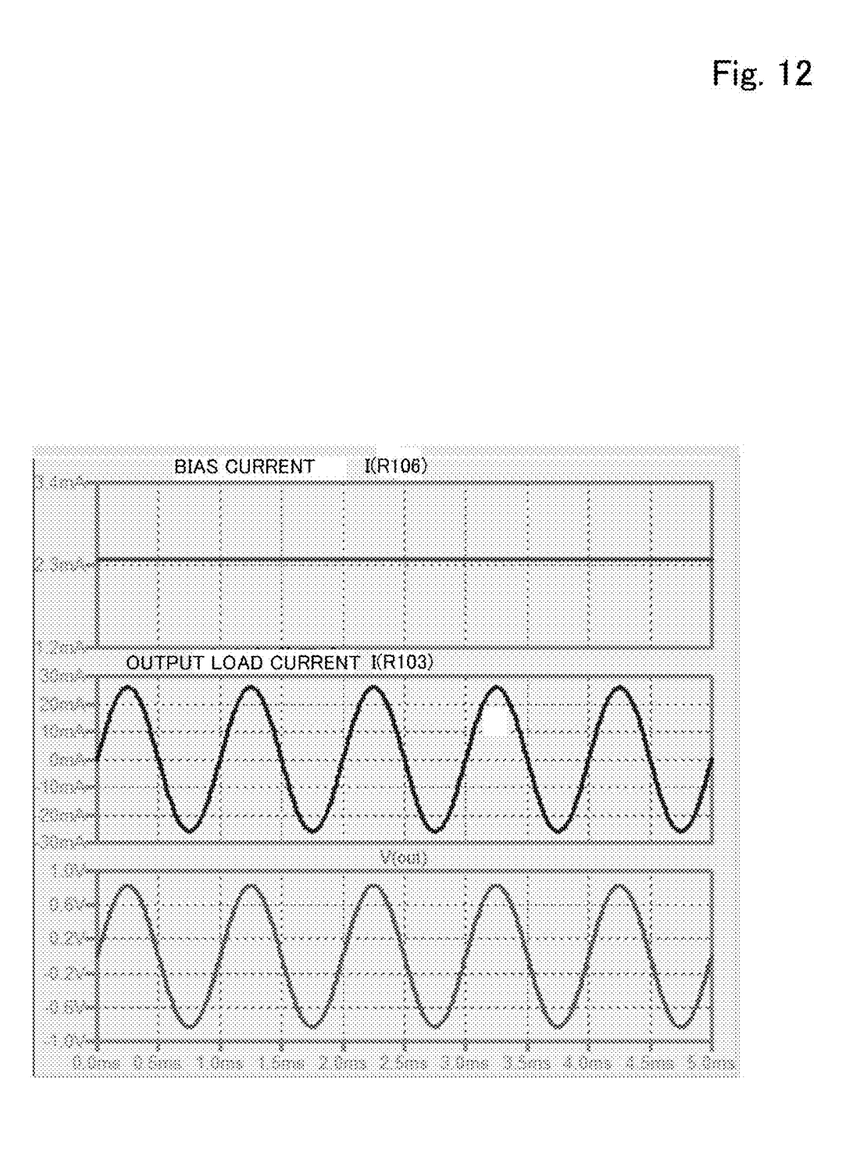

FIG. 11 is a diagram illustrating a configuration of a circuit which solves the above mentioned problem. Compared with FIG. 9, bipolar transistors Q105 and Q106, resistors R106 to R108, and diodes D101 to D104 are added. The diodes D101 and D103, the resistor R106, and the bipolar transistor Q105 compose a constant current circuit (constant current source). Further, the diodes D102 and D104, the resistor R107, and the bipolar transistor Q106 compose a constant current circuit (constant current source). Decrease of the bias current is suppressed by the constant current circuit. Namely, in advance, bias current flows with constant current and the current is applied to base current. In this case, when momentary current is needed, current is constant current and it is impossible to flow not less than decided current (see FIG. 12). Further, in order to supply sufficient current, it is necessary to flow current which can correspond to load in advance in no load, and loss is large. In FIG. 12, an upper graph illustrates bias current, a middle graph illustrates load current, and a lower graph illustrates output voltage.

Figure 13:
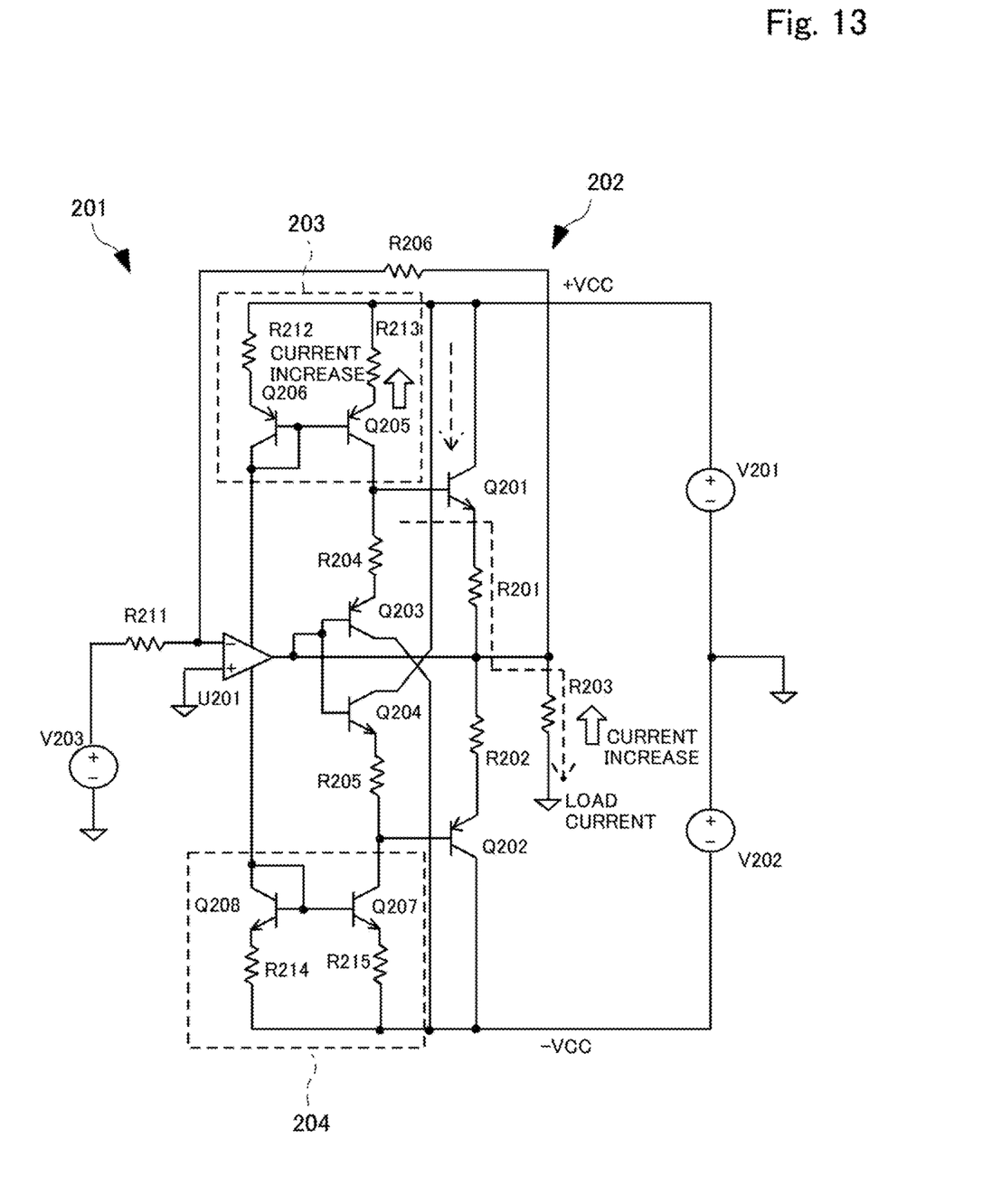
FIG. 13 is a diagram illustrating a circuit configuration of the amplification device according to JP 2017-241395.

FIG. 13 is a diagram illustrating a circuit configuration of an amplification device according to JP 2017-241395 which is applied by the applicant. As illustrated in FIG. 13, an amplification device 201 includes an operational amplifier U201, a diamond buffer circuit 202, and current mirror circuits 203 and 204. The current mirror circuit 203 is connected to a positive side power supply V201 (+VCC) and the diamond buffer circuit 202. Further, the current mirror circuit 203 is connected to a positive side power supply terminal of the operational amplifier U201. Herein, power supply current of the operational amplifier U201 is similar to an input signal. Therefore, when the input signal is large, power supply current of the operational amplifier U201 becomes large. For this reason, current which flows to a bipolar transistor Q206 becomes large, and current which flows to a bipolar transistor Q205 also becomes large. Thus, bias current which flows to a resistor R213 becomes large, sufficient current can flow to a base of a bipolar transistor Q201, and distortion characteristics do not deteriorate even if bias current in no signal is small.

Further, when the input signal is small, power supply current of the operational amplifier U201 becomes small and bias current which flows to a resistor R213 becomes small by the current mirror circuit 203. Thus, energy consumption does not become large.

In a negative side, the current mirror circuit 204 is connected to a negative side power supply V202 (−VCC) and the diamond buffer circuit 202. Further, the current mirror circuit 203 is connected to a negative side power supply terminal of the operational amplifier U201. For this reason, the same operation as a positive side occurs.

Figure 14:
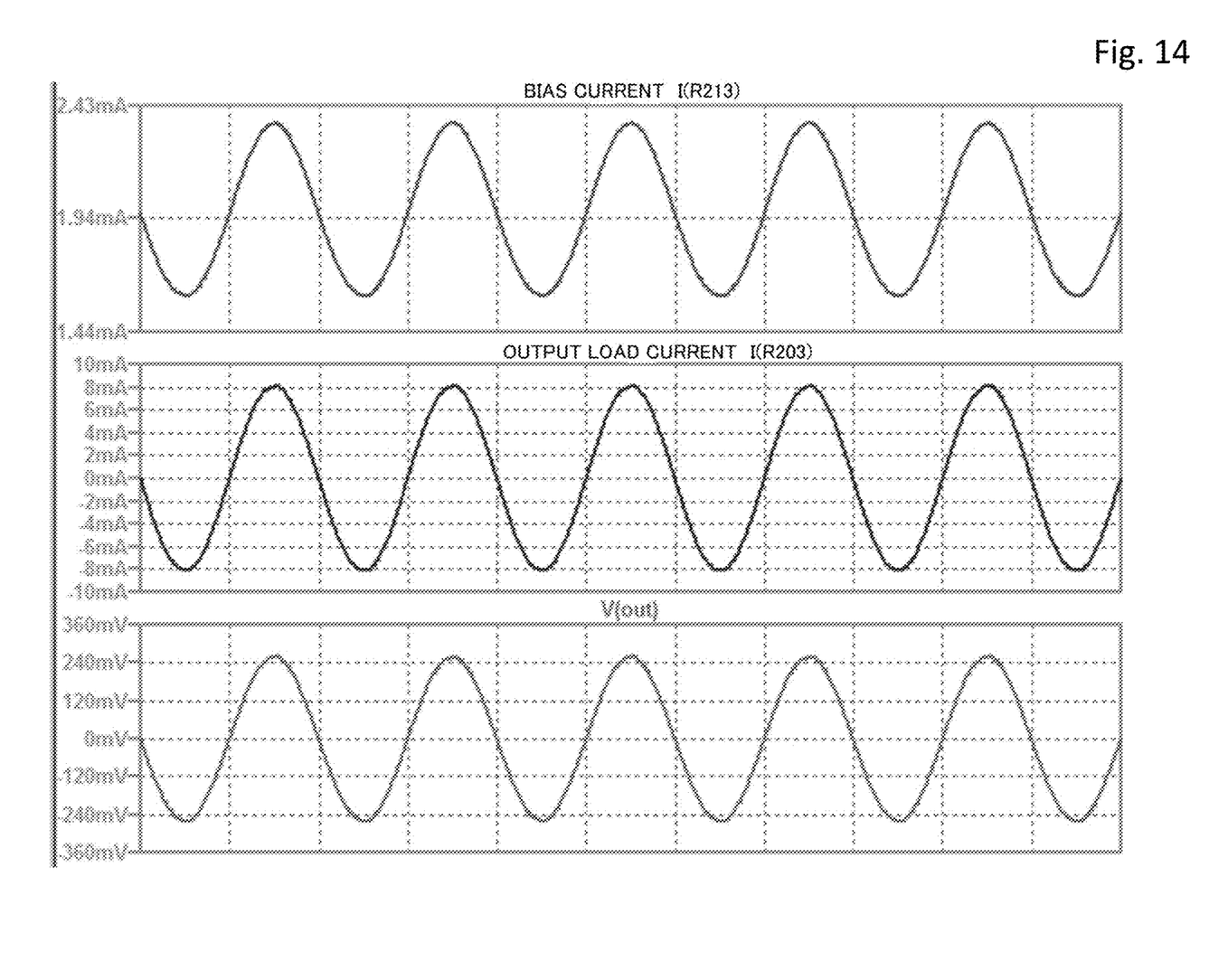

FIG. 14 is a graph illustrating load current and so on. An upper graph illustrates bias current which flows to the resistor R213. A middle graph illustrates output load current which flows to the load R203. A lower graph illustrates output voltage. As illustrated in FIG. 14, when load current increases, bias current also increases.

However, an invention illustrated in FIG. 13 is depend on power supply current of the operational amplifier and can only be achieved by the operational amplifier of one circuit. Further, for a reason of a circuit configuration of an inside operational amplifier, when power supply current is not relative to output current, it is hard to exert effect.

SUMMARY OF THE INVENTION

According to one aspect of the disclosure, there is provided an amplification device comprising: a push pull circuit which amplifies an input signal; a diamond buffer circuit to which the signal which is amplified by the push pull circuit is input; and a current mirror circuit which is connected to a power supply and the diamond buffer circuit and is connected to a retraction current terminal of the push pull circuit.

BRIEF DESCRIPTION OF THE DRAWINGS

FIG. 10 is a graph illustrating current which flows to a load and so on.

FIG. 12 is a graph illustrating current which flows to the load and so on.

FIG. 14 is a graph illustrating current which flows to the load and so on.

DETAILED DESCRIPTION OF THE PREFERRED EMBODIMENTS

An objective of the present invention is to provide an amplification device which sets energy consumption in idling small and does not deteriorate distortion characteristics without depending on the kind of an operation amplifier.

Figure 1:
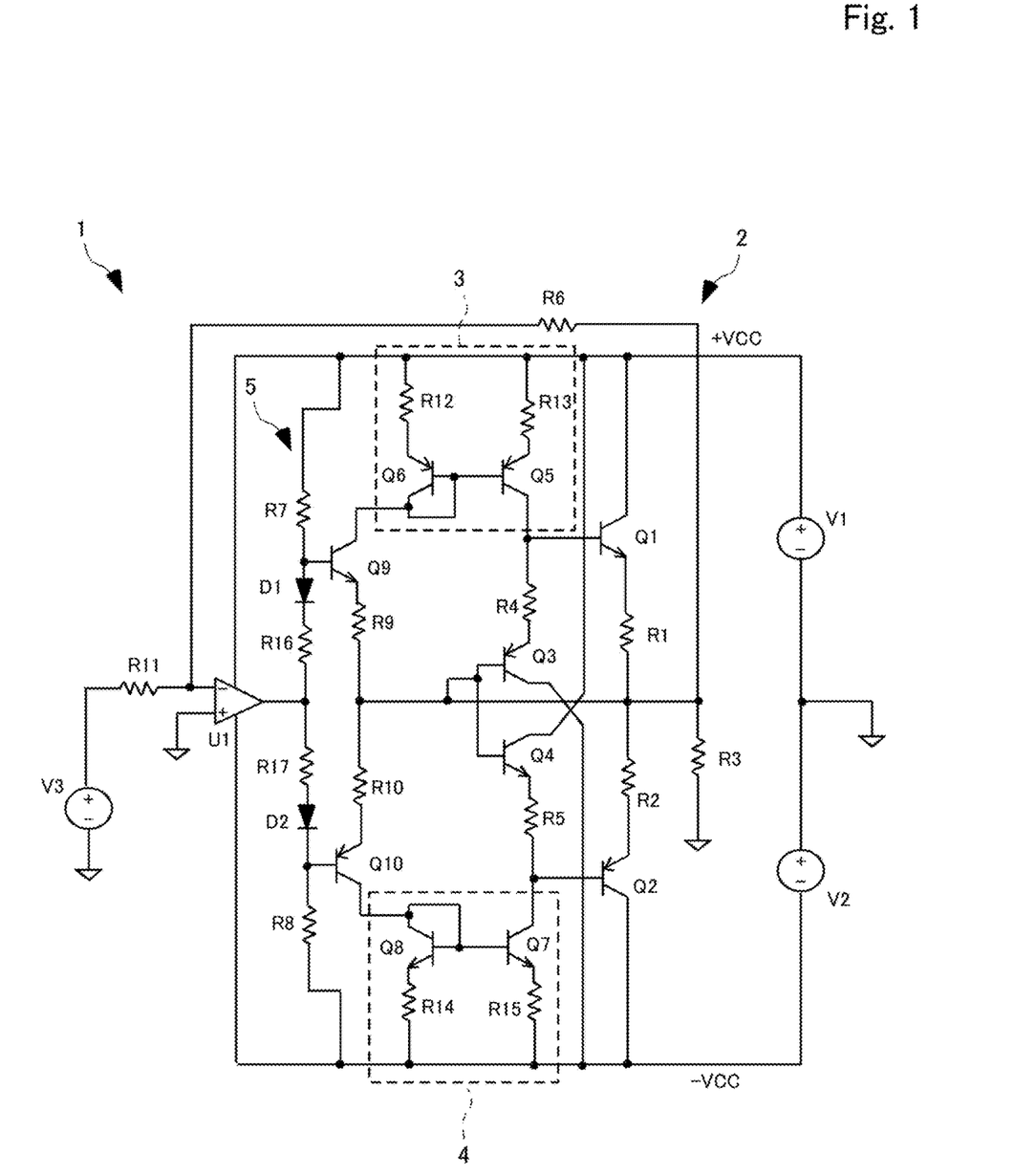
FIG. 1 is a diagram illustrating a circuit configuration of an amplification device according to an embodiment of the present invention.

An embodiment of the present invention is described below. As illustrated in FIG. 1, the amplification device 1 includes an operational amplifier U1, a diamond buffer circuit 2, current mirror circuits 3 and 4, and a push pull circuit 5.

The operational amplifier U1 amplifies an input signal. A signal is input to a negative side input terminal of the operational amplifier U1. Further, a resistor R11 (eleventh resistor) is connected to the negative side input terminal of the operational amplifier U1. A positive side input terminal of the operational amplifier U1 is connected to standard potential (ground). An output terminal of the operational amplifier U1 is connected to an input of the push pull circuit 5. A resistor R6 (sixth resistor) is connected between a load R3 and the negative side input terminal. Namely, an inverted amplification circuit is composed by the operational amplifier U1 and resistors R6 and R11.

A signal from the operational amplifier U1 is input to the push pull circuit 5. The push pull circuit 5 amplifies an input signal. The push pull circuit 5 has bipolar transistors Q9 and Q10, resistors R7 to R10, R16 and R17, and diodes D1 and D2.

The bipolar transistor Q9 (ninth bipolar transistor) is an npn type bipolar transistor. Abase of the bipolar transistor Q9 is connected between the resistor R7 (seventh resistor) and the diode D1 (first diode). A collector of the bipolar transistor Q9 is a positive side retraction current terminal which is connected to the current mirror circuit 3 (collector of bipolar transistor Q6). An emitter of the bipolar transistor Q9 is connected to an input of the diamond buffer circuit 2 (bases of bipolar transistors Q3 and Q4) via a resistor R9 (ninth resistor).

The bipolar transistor Q10 (tenth bipolar transistor) is a pnp type bipolar transistor. Abase of the bipolar transistor Q10 is connected between the resistor R8 (eighth resistor) and the diode D2 (second diode). A collector of the bipolar transistor Q10 is a positive side retraction current terminal which is connected to the current mirror circuit 4 (collector of bipolar transistor Q8). An emitter of the bipolar transistor Q10 is connected to the input of the diamond buffer circuit 2 (bases of bipolar transistors Q3 and Q4) via the resistor R10 (tenth resistor).

The resistor R7 is connected to a positive side power supply V1 (+VCC). The diode D1 is connected to the resistor R7 and the resistor R16. The resistor R8 is connected to a negative side power supply V2 (−VCC). The diode D2 is connected to the resistor R8 and the resistor R17. The resistor R16 (sixteenth resistor) is connected between the diode D1 and an input (output terminal of operational amplifier U1). The resistor R17 (seventeenth resistor) is connected between the diode D2 and the input (output terminal of the operational amplifier U1).

A signal which is amplified by the push pull circuit 5 is input to the diamond buffer circuit 2. The diamond buffer circuit 2 has bipolar transistors Q1 to Q4, and resistors R1, R2, R4 and R5. The bipolar transistor Q1 (first bipolar transistor) is an npn type bipolar transistor. A collector of the bipolar transistor Q1 is connected to the positive side power supply V1 (+VCC). An emitter of the bipolar transistor Q1 is connected to the load R3 via the resistor R1 (first resistor). A base of the bipolar transistor Q1 is connected to an emitter of the bipolar transistor Q3 via the resistor R4 (fourth resistor).

The bipolar transistor Q2 (second bipolar transistor) is a pnp type bipolar transistor. A collector of the bipolar transistor Q2 is connected to the negative side power supply V2 (−VCC). An emitter of the bipolar transistor Q2 is connected to the load R3 via the resistor R2 (second resistor). A base of the bipolar transistor Q2 is connected to an emitter of the bipolar transistor Q4 via the resistor R5 (fifth resistor).

The bipolar transistor Q3 (third bipolar transistor) is a pnp type bipolar transistor. A collector of the bipolar transistor Q3 is connected to the negative side power supply V2 (−VCC). An emitter of the bipolar transistor Q3 is connected to the base of the bipolar transistor Q1 and the current mirror circuit 3 via the resistor R4. A base of the bipolar transistor Q3 is connected to an output of the push pull circuit 5.

The bipolar transistor Q4 (fourth bipolar transistor) is an npn type bipolar transistor. A collector of the bipolar transistor Q4 is connected to the positive side power supply V1 (+VCC). An emitter of the bipolar transistor Q4 is connected to the base of the bipolar transistor Q2 and the current mirror circuit 4 via the resistor R5. Abase of the bipolar transistor Q4 is connected to the output of the push pull circuit 5.

The current mirror circuit 3 (first current mirror circuit) is connected to the positive side power supply V1 (+VCC) and the diamond buffer circuit 2. Further, the current mirror circuit 3 is connected to a positive side retraction current terminal (collector of bipolar transistor Q9) of the push pull circuit 5. The current mirror circuit 3 has bipolar transistors Q5 and Q6, and resistors R12 and R13.

The bipolar transistor Q5 (fifth bipolar transistor) is a pnp type bipolar transistor. A collector of the bipolar transistor Q5 is connected to the diamond buffer circuit 2 (resistor R4). An emitter of the bipolar transistor Q5 is connected to the positive side power supply V1 (+VCC) via the resistor R13 (thirteenth resistor). Abase of the bipolar transistor Q6 is connected to the base and the collector of the bipolar transistor Q6.

The bipolar transistor Q6 (sixth bipolar transistor) is a pnp type bipolar transistor. A collector of the bipolar transistor Q6 is connected to a base, the positive side retraction current terminal (collector of bipolar transistor Q9) of the push pull circuit 5, and the base of the bipolar transistor Q5. An emitter of the bipolar transistor Q6 is connected to the positive side power supply V1 (+VCC) via the resistor R12 (twelfth resistor). A base of the bipolar transistor Q6 is connected to the collector and the base of the bipolar transistor Q5.

The current mirror circuit 4 (second current mirror circuit) is connected to the negative side power supply V2 (−VCC)

and the diamond buffer circuit 2. Further, the current mirror circuit 4 is connected to the negative side retraction terminal (collector of bipolar transistor Q10) of the push pull circuit 5. The current mirror circuit 4 has bipolar transistors Q7 and Q8 and resistors R14 and R15.

The bipolar transistor Q7 (seventh bipolar transistor) is an npn type bipolar transistor. A collector of the bipolar transistor Q7 is connected to the diamond buffer circuit 2 (resistor R5). An emitter of the bipolar transistor Q7 is connected to the negative side power supply V2 (−VCC) via the resistor R15 (fifteenth resistor). A base of the bipolar transistor Q7 is connected to a base and a collector of the bipolar transistor Q8.

The bipolar transistor Q8 (eighth bipolar transistor) is an npn type bipolar transistor. A collector of the bipolar transistor Q8 is connected to abase, the negative side retraction current terminal (collector of bipolar transistor Q10) of the push pull circuit 5, and the base of the bipolar transistor Q7. An emitter of the bipolar transistor Q8 is connected to the negative side power supply V2 (−VCC) via the resistor R14 (fourteenth resistor). Abase of the bipolar transistor Q8 is connected to the collector and the base of the bipolar transistor Q7.

Figure 2:
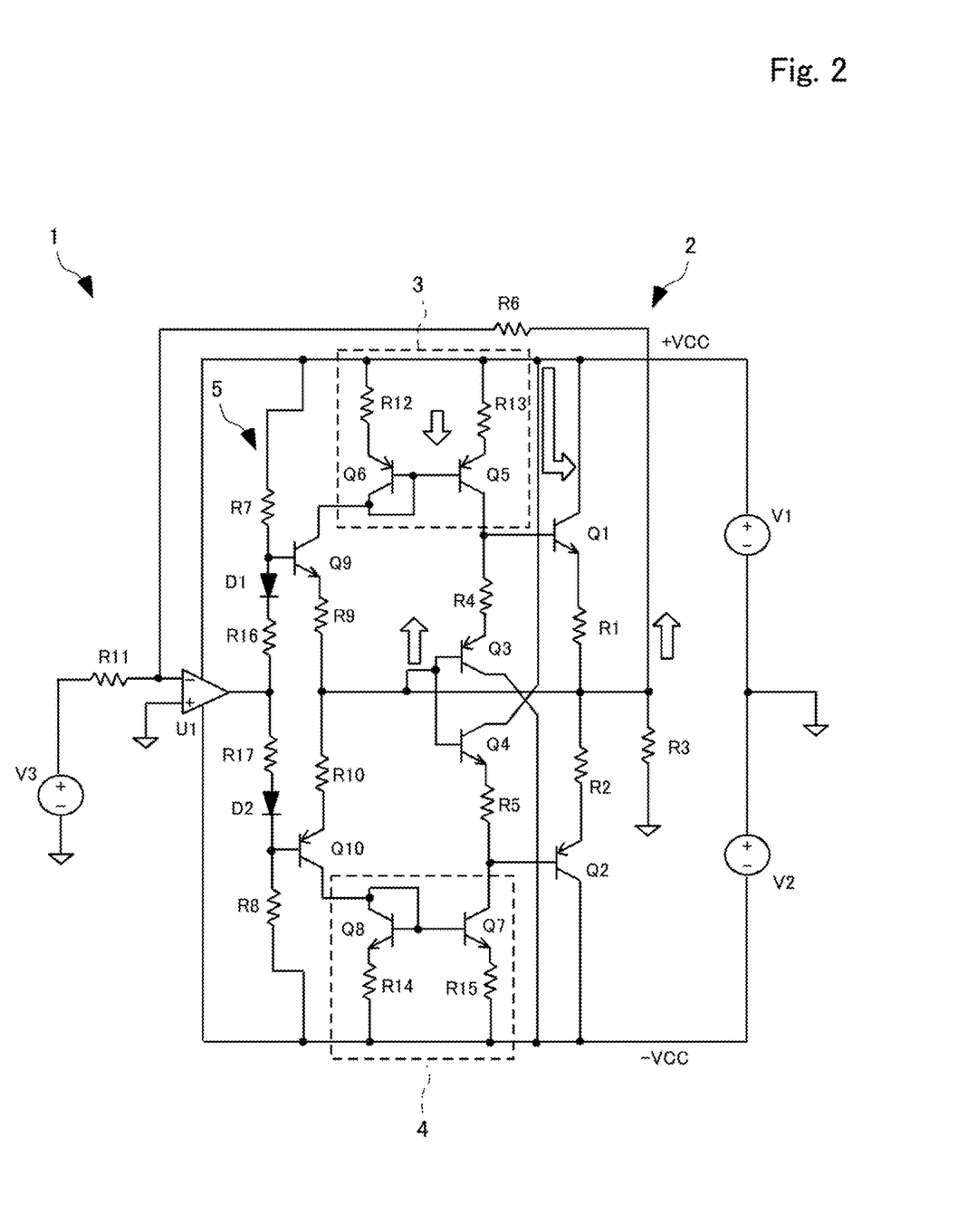
FIG. 2 is a diagram illustrating the circuit configuration of the amplification device according to the embodiment of the present invention

Herein, current is boosted from the bipolar transistor Q5. Further, current is squeezed from the bipolar transistor Q3. For this reason, the base of the bipolar transistor Q1 is pushed in (see FIG. 2). In the bipolar transistors Q2, Q4, and Q6, the same situation occurs.

As described above, the current mirror circuit 3 (collector of bipolar transistor Q6) is connected to the positive side retraction current terminal (collector of bipolar transistor Q9) of the push pull circuit 5. Thus, when an input signal is large, a retraction current of the push pull circuit 5 becomes large. For this reason, current which flows to the bipolar transistor Q6 becomes large, and current which flows to the bipolar transistor Q6 also becomes large. Thus, bias current which flows to the resistor R13 becomes large and sufficient current can flow to the base of the bipolar transistor Q1, and even if bias current in no signal is small, distortion characteristic does not deteriorate.

Further, when the input signal is small, retraction current of the push pull circuit 5 becomes small and bias current which flows to the resistor R13 becomes small by the current mirror circuit 3. Thus, energy consumption does not become large.

In negative side, the current mirror circuit 4 (the collector terminal of the bipolar transistor Q8) is connected to the negative side retraction current terminal of the push pull circuit 5 (the collector of the bipolar transistor Q10). For this reason, the same operation as the positive side occurs.

Figure 3:
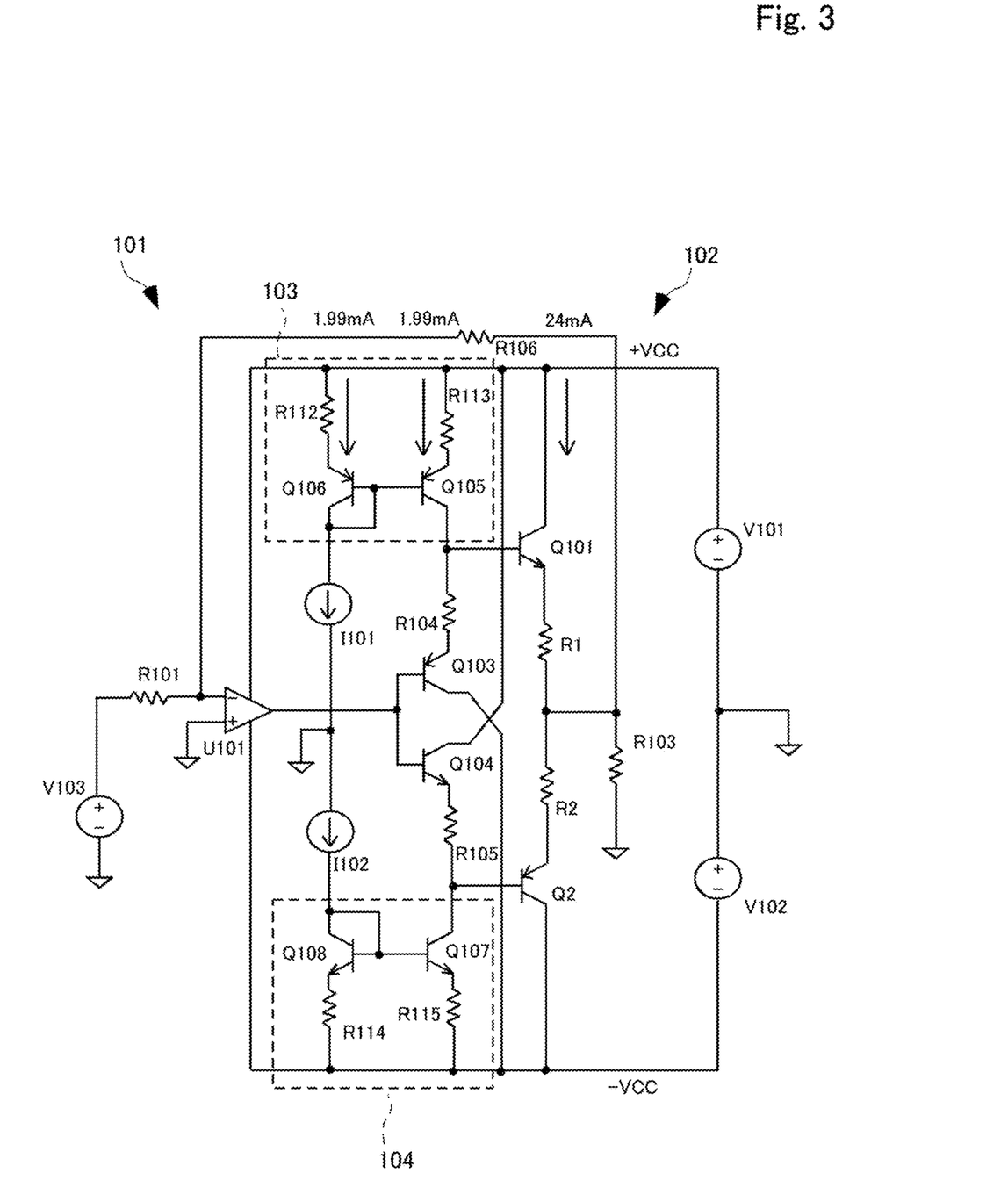
FIG. 3 is a diagram illustrating a circuit configuration of an amplification device using a conventional diamond buffer circuit.

FIG. 3 is a diagram illustrating a circuit configuration of an amplification circuit which uses a diamond buffer circuit which uses a conventional constant current supply. Compared with the amplification device 201 according to JP 2017-241395, the amplification device is different from the following configuration.

(1) A positive side power supply terminal of an operational amplifier U101 is directly connected to a positive side power supply V101 (+VCC).
(2) A negative side power supply terminal of the operational amplifier U101 is directly connected to a negative side power supply V102 (−VCC).
(3) A current mirror circuit 103 (the collector of the bipolar transistor Q106) is connected to a current supply I101.
(4) A current mirror circuit 104 (the collector of the bipolar transistor Q108) is connected to a current supply I102.

Figure 4:
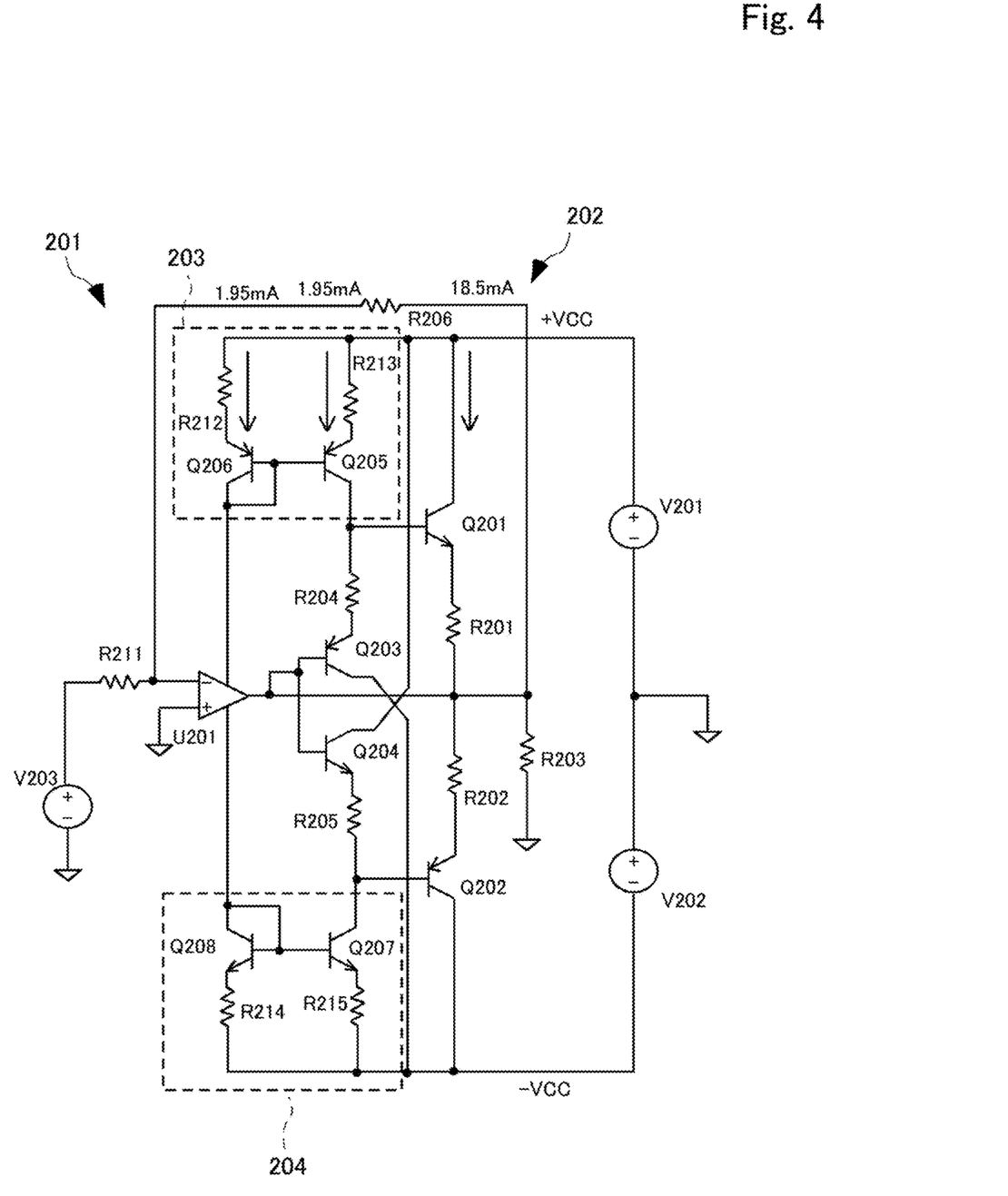
FIG. 4 is a diagram illustrating a circuit configuration of an amplification device according to JP 2017-241395.
Figure 5:
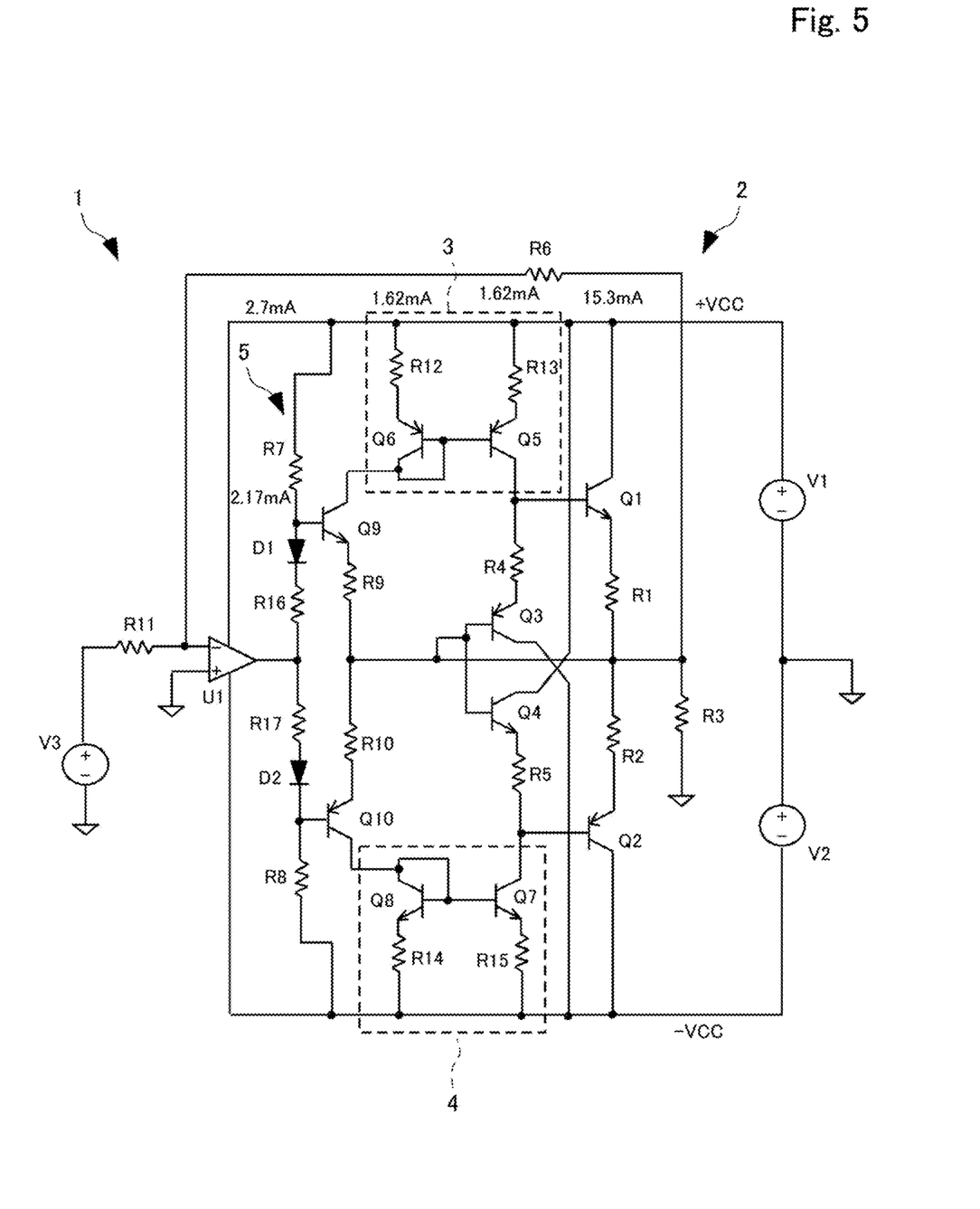
FIG. 5 is a diagram illustrating the circuit configuration of the amplification device according to the embodiment of the present invention.

FIG. 4 is a diagram illustrating a circuit configuration of an amplification device according to JP 2017-241395. FIG. 5 is a diagram illustrating a circuit configuration of an amplification device according to an embodiment of the present invention. In each of FIG. 3 to FIG. 5, each of a load R103, a load R203, and a load R3 is a relatively heavy load of 8 ohm and 5 mW. In each of FIG. 3 to FIG. 5, current value which flows to each section is illustrated. Bias current is almost the same condition. In FIG. 3, sum current is 27.98 mA. Distortion rate is 0.003610%. In FIG. 4, sum current is 22.4 mA. Distortion rate is 0.000885%. In FIG. 5, sum current is 23.41 mA. Distortion rate is 0.000541%. In the amplification device 201 according to JP 2017-241395 and the amplification device 1 according to the embodiment of the present invention, consumption current is the almost same though distortion rate of the amplification device 1 is 61% of the amplification device 201.

Figure 6:
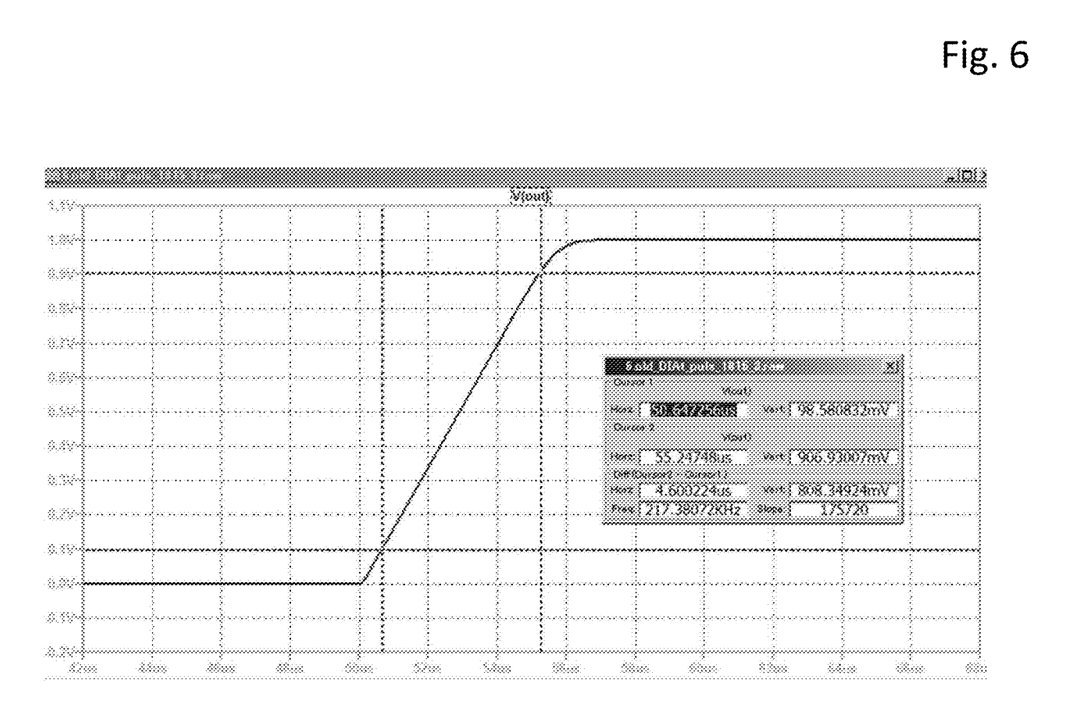
FIG. 6 is a diagram illustrating rising in a conventional amplification device.
Figure 7:
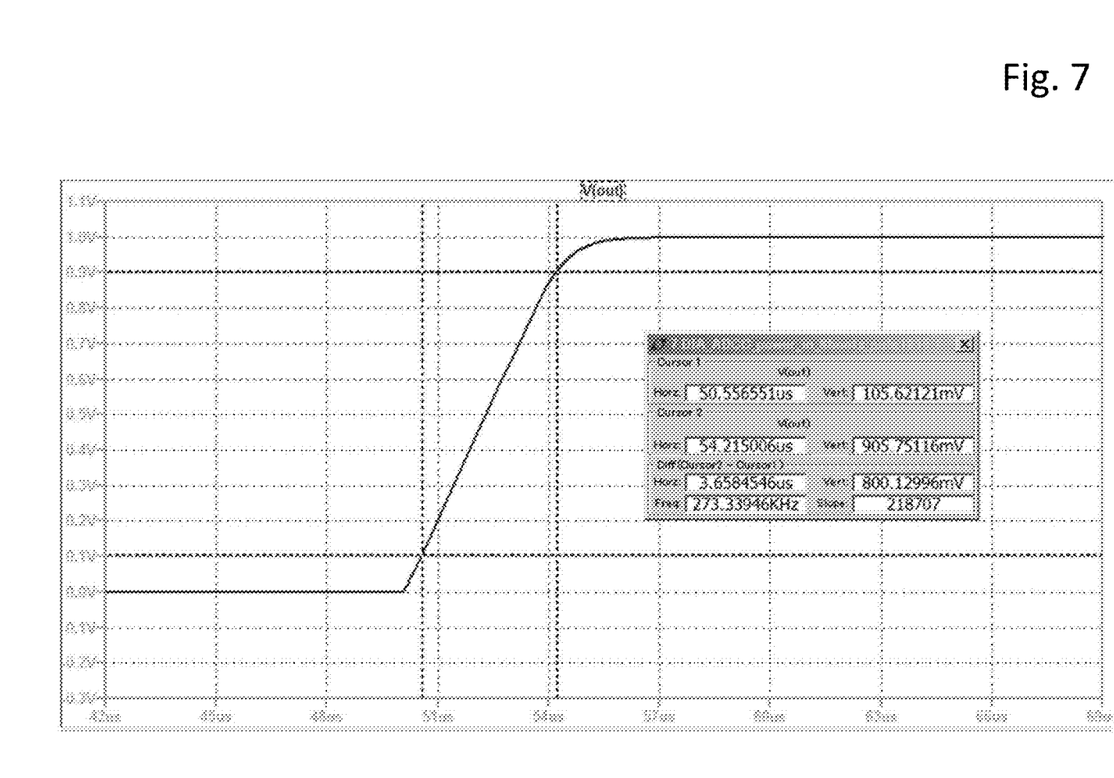
FIG. 7 is a diagram illustrating rising in the amplification device according to JP 2017-241395.
Figure 8:
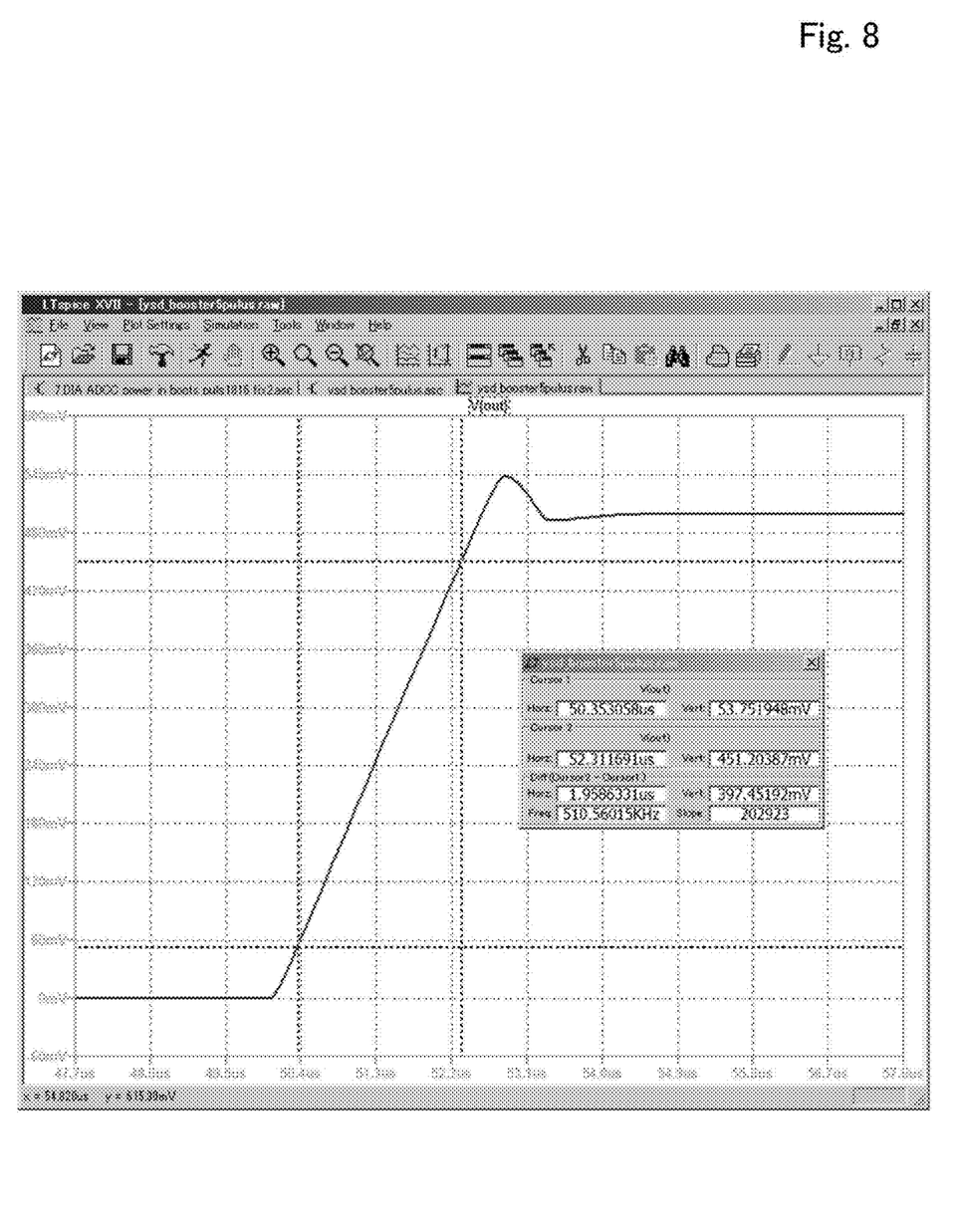
FIG. 8 is a diagram illustrating rising in the amplification device according to the embodiment of the present invention.

It is thought that current supply ability is also improved because bias current is increased or decreased based on a signal. Time of rising (falling because of inverted output) is measured and compared using square wave as input. As condition, bias current is the same and compared to each other. FIG. 6 is a diagram illustrating rising in the conventional amplification device. FIG. 7 is a diagram illustrating rising in the amplification device according to JP 2017-241395. FIG. 8 is a diagram illustrating rising in the amplification device according to the embodiment of the present invention. Rising time in the amplification device 101 is 4.6 µs (10%-90%). Rising time in the amplification device 201 is 3.7 µs (10%-90%). Rising time in the amplification 1 is 1.96 µs (10%-90%). In this manner, in the amplification device 1, falling of output can be speeded up than the amplification devices 101 and 201.

As described above, in the present embodiment, the current mirror circuits 3 and 4 are connected to the retraction current terminals of the push pull circuit 5. Thus, when the input signal is large, retraction current of the push pull circuit 5 becomes large and bias current which flows to the diamond buffer circuit 2 becomes large by the current mirror circuits 3 and 4. Thus, distortion characteristics do not deteriorate because it is possible to flow sufficient bias current.

Further, when the input signal is small, retraction current of the push pull circuit 5 becomes small and bias current which flows to the diamond buffer circuit 2 becomes small by the current mirror circuits 3 and 4. Thus, energy consumption does not become large.

In this manner, it is possible to provide the amplification device in which energy consumption does not become large in idling and in which distortion characteristics do not deteriorate without depending on the kind of an operation amplifier.

The embodiment of the present invention is described above, but the mode to which the present invention is applicable is not limited to the above embodiment and can be suitably varied without departing from the scope of the present invention.

The present invention can be suitably employed in an amplification device which amplifies a signal.

What is claimed is:
1. An amplification device comprising:
a push pull circuit which amplifies an input signal;
a diamond buffer circuit to which the signal which is amplified by the push pull circuit is input; and
a current mirror circuit which is connected to a power supply and the diamond buffer circuit and is connected to a retraction current terminal of the push pull circuit, wherein the current mirror circuit has
a first current mirror circuit which is connected to a positive side power supply and the diamond buffer circuit and is connected to a positive side retraction current terminal of the push pull circuit and
a second current mirror circuit which is connected to a negative side power supply and the diamond buffer circuit and is connected to a negative side retraction current terminal of the push pull circuit, and
the diamond buffer circuit has
an npn type first bipolar transistor in which a collector is connected to the positive side power supply, in which an emitter is connected to a load via a first resistor, and in which a base is connected to an emitter of a third bipolar transistor via a fourth resistor,
a pnp type second bipolar transistor in which a collector is connected to the negative side power supply, in which an emitter is connected to the load via a second resistor, and in which a base is connected to an emitter of a fourth bipolar transistor via a fifth resistor,
the pnp type third bipolar transistor in which a collector is connected to the negative side power supply, in which an emitter is connected to the base of the first bipolar transistor and the first current mirror circuit via the fourth resistor, and in which a base is connected to an output of the push pull circuit, and
the npn type fourth bipolar transistor in which a collector is connected to the positive side power supply, in which an emitter is connected to the base of the second bipolar transistor and the second current mirror circuit via the fifth resistor, and in which a base is connected to the output of the push pull circuit.

2. The amplification device according to claim 1,
wherein the first current mirror circuit has
a pnp type fifth bipolar transistor in which a collector is connected to the diamond buffer circuit, in which an emitter is connected to the positive side power supply via a thirteenth resistor, and in which a base is connected to a base and a collector of a sixth bipolar transistor, and
the pnp type six bipolar transistor in which a collector is connected to a base, the positive side retraction current terminal of the push pull circuit, and the base of the fifth bipolar transistor, in which an emitter is connected to the positive side power supply via a twelfth resistor, and in which the base is connected to the collector and the base of the fifth bipolar transistor, and
the second current mirror circuit has an npn type seventh bipolar transistor in which a collector is connected to the diamond buffer circuit, in which an emitter is connected to the negative side power supply via a fifteenth resistor, and in which a base is connected to a base and a collector of an eighth bipolar transistor, and
the npn type eighth bipolar transistor in which a collector is connected to the base, the negative side retraction current terminal of the push pull circuit, and the base of the seventh bipolar transistor, in which an emitter is connected to the negative side power supply via a fourteenth resistor, and in which the base is connected to the collector and the base of the seventh bipolar transistor.

3. An amplification device comprising:
a diamond buffer circuit to which the signal which is amplified by the push pull circuit is input; and
a current mirror circuit which is connected to a power supply and the diamond buffer circuit and is connected to a retraction current terminal of the push pull circuit,
wherein the current mirror circuit has
a first current mirror circuit which is connected to a positive side power supply and the diamond buffer circuit and is connected to a positive side retraction current terminal of the push pull circuit and
a second current mirror circuit which is connected to a negative side power supply and the diamond buffer circuit and is connected to a negative side retraction current terminal of the push pull circuit, and
the push pull circuit has
an npn type ninth bipolar transistor in which a base is connected between a seventh resistor and a first diode, in which a collector is the positive side retraction current terminal which is connected to the first current mirror circuit, and in which an emitter is connected to an input of the diamond buffer circuit via a ninth resistor,
a pnp type tenth bipolar transistor in which a base is connected between an eighth resistor and a second diode, in which a collector is the negative side retraction current terminal which is connected to the second current mirror circuit, and in which an emitter is connected to an input of the diamond buffer circuit via a tenth resistor,
a sixteenth resistor which is connected between the first diode and an input, and
a seventeenth resistor which is connected between the second diode and the input.

4. The amplification circuit according to claim 1 further comprising: an operational amplifier which amplifies an input signal,
wherein a signal is input to a negative side input terminal of the operational amplifier via an eleventh resistor,
a positive side input terminal of the operational amplifier is connected to standard potential,
an output terminal of the operational amplifier is connected to an input of the push pull circuit, and
a sixth resistor is connected between the load and the negative side input terminal of the operational amplifier.

* * * * *